United States Patent
Tachibana et al.

(10) Patent No.: US 7,042,299 B2
(45) Date of Patent: May 9, 2006

(54) CRYSTAL OSCILLATION CIRCUIT

(75) Inventors: Suguru Tachibana, Kawasaki (JP);
Tomonari Morishita, Kawasaki (JP);
Fukuji Kihara, Kawasaki (JP);
Makoto Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/099,517

(22) Filed: Apr. 6, 2005

(65) Prior Publication Data

US 2005/0174183 A1    Aug. 11, 2005

Related U.S. Application Data

(63) Continuation of application No. PCT/JP03/04794, filed on Apr. 15, 2003.

(51) Int. Cl.
*H03B 5/36* (2006.01)
*H03L 1/00* (2006.01)
*H03L 1/02* (2006.01)

(52) U.S. Cl. .................. 331/158; 331/116 FE; 331/176; 331/186

(58) Field of Classification Search ............ 331/116 R, 331/116 FE, 158, 175–176, 185–186
See application file for complete search history.

(56) References Cited

U.S. PATENT DOCUMENTS

| 4,430,008 | A | * | 2/1984 | Nishikubo ............ 368/202 |
| 6,025,757 | A | | 2/2000 | Tsukagoshi et al. |
| 6,097,257 | A | | 8/2000 | Kadowaki et al. |
| 2001/0020876 | A1 | | 9/2001 | Tsukagoshi et al. |

FOREIGN PATENT DOCUMENTS

| JP | 59-216306 A | 12/1984 |
| JP | 62-132405 A | 6/1987 |
| JP | 04-094201 | 3/1992 |
| JP | 05-303438 A | 11/1993 |
| JP | 06-059756 | 3/1994 |
| JP | 06-59756 A | 3/1994 |
| JP | 06-177646 | 6/1994 |
| JP | 07-007325 | 1/1995 |
| JP | 2000-075947 A | 3/2000 |
| JP | 2002-359524 | 12/2002 |

* cited by examiner

*Primary Examiner*—David Mis
(74) *Attorney, Agent, or Firm*—Arent Fox PLLC

(57) ABSTRACT

A crystal oscillation circuit has a reduced circuit area and enables to stably oscillate at low consumed current. The crystal oscillation circuit includes an oscillating amplifier and a constant voltage generator. The oscillating amplifier excites a resonator composed of a resistor, a crystal oscillator and a capacitor. The constant voltage generator includes a one-stage differential circuit composed of a transistor and a capacitor for suppressing transient fluctuation of a constant voltage Vreg for generating the constant voltage Vreg served as a supply voltage for the oscillating amplifier. By generating the constant voltage Vreg through the one-stage differential circuit, the phase lag of the constant voltage Vreg reaches 90 degrees at most. This eliminates the necessity of a phase compensation capacitor, resulting in making the circuit area smaller and realizing the stable oscillation at low consumed current.

7 Claims, 14 Drawing Sheets

US 7,042,299 B2

CRYSTAL OSCILLATION CIRCUIT

This application is a continuing application, filed under 35 U.S.C. §111(a), of International Application PCT/JP2003/004794, filed Apr. 15, 2003.

BACKGROUND OF THE INVENTION (1) Field of the Invention

The present invention relates to a crystal oscillation circuit, and more particularly to a crystal oscillation circuit which is served to oscillate on the basis of an oscillation frequency of a crystal oscillator.

(2) Description of the Related Art

An oscillation circuit provided with a crystal oscillator is widely used in various appliances such as a watch, a cellular phone and a computer terminal because the oscillation circuit is stable in frequency. For these portable electronic appliances., the life of a cell built therein is a significant performance characteristic. Hence, the lower power consumption of the crystal oscillation circuit that is being constantly operated in such an appliance has been an important technical issue.

In order to lower the power consumption of the crystal oscillation circuit, conventionally, a constant voltage generator dedicated to the crystal oscillation circuit has been provided so that a constant electric power may be supplied to an oscillating amplifier located in the circuit, for reducing the power consumption of the crystal oscillation circuit. (Refer to the Official Gazettes of Japanese Unexamined Patent Publication No. 10-213686 (pages 8–9 and FIG. 2), Japanese Unexamined Patent Publication No. 04-94201 (page 3 and FIG. 1), Japanese Unexamined Patent Publication No. 06-59756 (page 3 and FIG. 2), and Japanese Unexamined Patent Publication No. 2002-359524 (page 3 and FIG. 1).)

FIG. 10 shows the conventional crystal oscillation circuit. As shown, the crystal oscillation circuit is arranged to have a PMOS transistor M101, an NMOS transistor M102, a resistor R101, a crystal oscillator X101, capacitors C101 and C102, and a constant voltage generator 101.

The constant voltage generator 101 is composed of an operational amplifier Z101. The operational amplifier Z101 is supplied with a voltage sent from a power supply Vdd. The operational amplifier Z101 is inputted with a reference voltage Vref at its positive phase input terminal. Further, the operational amplifier Z101 supplies a constant voltage Vreg. The constant voltage generator 101 operates to supply the transistors M101 and M102 with a constant voltage Vreg of e.g. 2 V to 1.2 V. In general, the constant voltage generator 101 composes a voltage follower circuit through the use of the operational amplifier Z101 as shown in FIG. 10.

The capacitors C101 and C102 compose a positive feedback circuit with the crystal oscillator X101. The transistors M101 and M102 are served as an oscillating amplifier (oscillating inverter) for exciting an exciter composed of the crystal oscillator X101. The resistor R101 is a feedback resistor for specifying the operating points of the transistors M101 and M102 served as the oscillating inverter.

The transistors M101 and M102, the capacitors C101 and C102, and the crystal oscillator X101 compose an oscillation circuit, which oscillates the oscillation voltages ampin and ampout at a resonant frequency substantially determined by the crystal oscillator X101. In order to keep the oscillation, the transistors M101 and M102 are indispensable because those transistors amplify the oscillation voltage ampin and compensate for a loss. caused by the crystal oscillator X101. The transistors M101 and M102 are supplied with a constant voltage Vreg sent from the constant voltage generator 101 and drive the capacitors C101 and C102 and the crystal oscillator X101 with the supplied constant voltage Vreg. The constant voltage Vreg to be supplied to the transistors M101 and M102 is specified so that the constant voltage Vreg may be large enough to keep the oscillation but small enough not to make an idle passage current too large.

The constant voltage Vreg is generated by the voltage follower circuit (operational amplifier Z101) being inputted with the reference voltage Vref as shown in FIG. 10. The voltage follower circuit generates a constant voltage Vreg of e.g. 2 V to 1.2 V without depending on the voltage value of the power supply Vdd and then supplies the constant voltage to the transistors M101 and M102. This voltage follower circuit therefore causes the crystal oscillation circuit to keep its oscillation and the transistors M101 and M102 to avoid idle power consumption.

FIG. 11 illustrates an operational amplifier composing the voltage follower shown in FIG. 10. As shown in FIG. 11, the operational amplifier composing the voltage follower is made up of PMOS transistors M103, M104 and M107, NMOS transistors M105, M106, M108 and M109, and capacitors C103 and C104. The transistor M105 is inputted with the reference voltage Vref. The sources of the transistors M103, M104 and M107 are inputted with the voltage of the power supply Vdd. The transistor M107 outputs the constant voltage Vreg at its drain. The gates of the transistors M108 and M109 are inputted with a bias voltage NB101.

The connection of a minus input terminal (reverse phase input terminal) of a circuit generally called a two-stage operational amplifier as shown in FIG. 11 with an output electric potential (the specification of the gate potential of the transistor M106 into the constant voltage Vreg) composes the voltage follower, so that the constant voltage Vreg is substantially equal to the reference voltage Vref. Giving the reference voltage Vref a voltage of e.g. 2 V to 1.2 V without depending on the voltage value of the power supply Vdd, the voltage follower generates a constant voltage Vreg of e.g. 2 V to 1.2 V without depending on the voltage value of the power supply Vdd. Since the two-stage operational amplifier has a large gain, the constant voltage Vreg is accurately matched to the reference voltage Vref.

The use of the foregoing voltage follower has made it possible to lower the power consumption of the crystal oscillation circuit.

Moreover, as an alternative means, the supply of constant current to an oscillating inverter leads to reducing the power consumption of a crystal oscillation circuit. (For example, refer to the Official Gazettes of Japanese Unexamined Patent Publication No. 07-7325 (page 5 and FIG. 2), Japanese Unexamined Patent Publication No. 11-150419 (page 3 and FIG. 1), Japanese Unexamined Patent Publication No. 2002-359524 (page 7 and FIG. 4), Japanese Unexamined Patent Publication No. 11-150420 (page 3 and FIG. 1), and Japanese Unexamined Patent Publication No. 2004-177646 (page 2 and FIG. 1)). FIG. 12 illustrates the second conventional crystal oscillation circuit. As shown, the crystal oscillation circuit is arranged to have PMOS transistors M110, M112 and M113, NMOS transistors M111, a depletion NMOS transistor M114, a resistor R102, a crystal oscillator X102, and capacitors C105 and C106. The transistors M110 and M111 compose an oscillating inverter.

FIG. 13 illustrates the third conventional crystal oscillation circuit. In the crystal oscillation circuit shown in FIG. 13, the same components as those shown in FIG. 12 have the same reference numbers and are not described herein. As shown in FIG. 13, the transistor M110 composing the oscillating inverter is connected with the transistor M115 that supplies current.

FIG. 14 illustrates the fourth conventional crystal oscillation circuit. In the crystal oscillation circuit shown in FIG. 14, the same components as those shown in FIG. 12 have the same reference numbers and are not described herein. As shown in FIG. 14, the gates of the transistors M110 and M111 composing the oscillating inverter are connected with the capacitors C107 and C108 respectively. Further, a resistor R103 is connected between the gate and the drain of the transistor M111. Moreover, the constant voltage output circuit composed of PMOS transistors M116 and M117, NMOS transistors M118 and M119, and a resistor R105 supplies a bias voltage to the gate of the transistor M110 through a resistor R104.

In FIGS. 12 to 14, the functions of the transistors M110 and M111, the capacitors C105 and C106 and the crystal oscillator X102, all of which compose the oscillating inverter, are the same as those of the crystal oscillation circuit shown in FIG. 10. Hence, the description about the function of those components is left out. Then, the description will be oriented to the supply of current to the transistors M110 and M111.

In the crystal oscillation circuit shown in FIG. 12, the current defined by the depletion NMOS transistor N114 is supplied to the transistors M110 and M111 composing the oscillating inverter so that the inverter may be operated. In the crystal oscillation circuit shown in FIG. 13, keeping the gate potential of the transistor M115 at the ground GND (of the power supply Vdd), current is supplied to the transistors M110 and M111 composing the oscillating inverter so that the inverter may be operated. In the crystal oscillation circuit shown in FIG. 14, given a bias voltage to the gate of the transistor M110 composing the oscillating inverter through the resistor R104, the current flowing through the transistors M110 and M111 is controlled so that the inverter may be operated.

As described above, the supply of constant current to the oscillating inverter has led to lowering the power consumption of the crystal oscillation circuit.

In the meantime, with recent reduction of electronic appliances in size, a request for improving performance of portable electronic appliances is growing more and more. As described above, for the portable electronic appliances or a watch, the life of a cell built therein is a significant performance characteristic. Hence, the lower power consumption of the crystal oscillation circuit that is constantly operated in these appliances becomes a more and more important technical issue.

However, in the case of using the two-stage operational amplifier as shown in FIG. 11 as the voltage follower, it is necessary to design a frequency characteristic of a negative feedback loop so as not to make the operation of the voltage follower unstable due to its oscillation. For that purpose, the capacitor for phase compensation is used for the two-stage operational amplifier. In general, this type of capacitor needs a disadvantageously large capacitance and circuit area.

Concretely, as shown in FIG. 11, it is necessary to provide the capacitor C103 at the first stage output (the drains of the transistors M103 and M105) of the two-stage operational amplifier and at the second stage output (the drains of the transistors M107 and M109). This allows a dominant pole to be sufficiently kept away a second pole on a frequency axis, resulting in being able to ensure enough phase margin even in the case of driving a capacitive load (capacitor C104).

In a case that the load connected with the drains of the transistors M107 and M109 are capacitive, the capacitor C103 for phase compensation is required to be provided according to the capacitance of the load. However, in a case that the load capacitance is small or no stabilization capacitance is specially provided for the constant voltage Vreg, the provision of the phase compensation capacitor may be unnecessary. That is, in a case that the load capacitance is large, the capacitance of the capacitor C103 is required to be large accordingly. On the other hand, in order to prevent increase of an occupation area, it is considered that the capacitance of the capacitor C104 for suppressing transient fluctuation of the constant voltage Vreg is suppressed to be lower. In this case, however, if the constant voltage Vreg is greatly fluctuated, it is necessary to make the set potential high enough to keep the oscillation at the constant voltage Vreg dropped by the larger transient fluctuation. This results in increasing the power consumption of the crystal oscillation circuit.

Further, in the method of supplying constant current to the oscillating inverter for reducing the circuit power, in the circuit shown in FIG. 12, since the current defined in the depletion NMOS transistor M114 is supplied to the transistors M110 and M111, the current to be supplied is likely to be adversely influenced by the manufacturing variation of the transistor M114 and thus is not stable. Moreover, in the CMOS process, it is necessary to prepare the depletion MOS transistor that is not commonly available. This was a problem.

In FIG. 13, keeping the gate potential of the transistor M115 at the GND causes the transistors M110 and M111 composing the oscillating inverter to be inputted with current from the power supply Vdd. This current depends on the voltage of the power supply Vdd and thus is made smaller if the voltage of the power supply Vdd is low. Hence, if the circuit is designed so that the oscillation may be kept even at a lower voltage of the power supply Vdd, the current is made larger than required if the voltage of the power supply Vdd is high and moreover the current is likely to be adversely influenced by the manufacturing variation of the transistor M115. This was a problem as well.

In the circuit shown in FIG. 14, the use of a circuit having a thermal voltage as its reference (a circuit composed of the transistors M116 to M119 and the resistor R105) for a circuit for supplying a bias voltage to the transistor M110 of the oscillating inverter circuit leads to improving dependency of the bias current on the power supply. Further, the bias circuit is not so much influenced by the manufacturing variation of the MOS transistor. However, the supply of the bias voltage for controlling current to the gate of the transistor M110 composing the oscillating inverter keeps the output amplitudes of the transistors M110 and M111 at the voltage of the power supply Vdd. Hence, for controlling the signal amplitude, it is necessary to supply the constant voltage of the power supply Vdd. That is, in the circuit shown in FIG. 14, though the circuit for overcoming the dependency of the bias voltage on the supply voltage is used, another circuit for generating a voltage is required for controlling the signal amplitude. These two circuits disadvantageously make the overall oscillation circuit complicated.

SUMMARY OF THE INVENTION

The present invention is made in consideration of the foregoing respects, and it is an object of the present invention to provide a crystal oscillation circuit which has a simple and small circuit arrangement and offers stable oscillation at lower power consumption.

In carrying out the object, a crystal oscillation circuit is provided which oscillates on the basis of an oscillation frequency of a crystal oscillator. The crystal oscillation circuit includes a resonator connected with the crystal oscillator, an oscillating amplifier for exciting the resonator, and a constant voltage generator for supplying a constant supply voltage to the oscillating amplifier through the use of a one-stage differential circuit.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
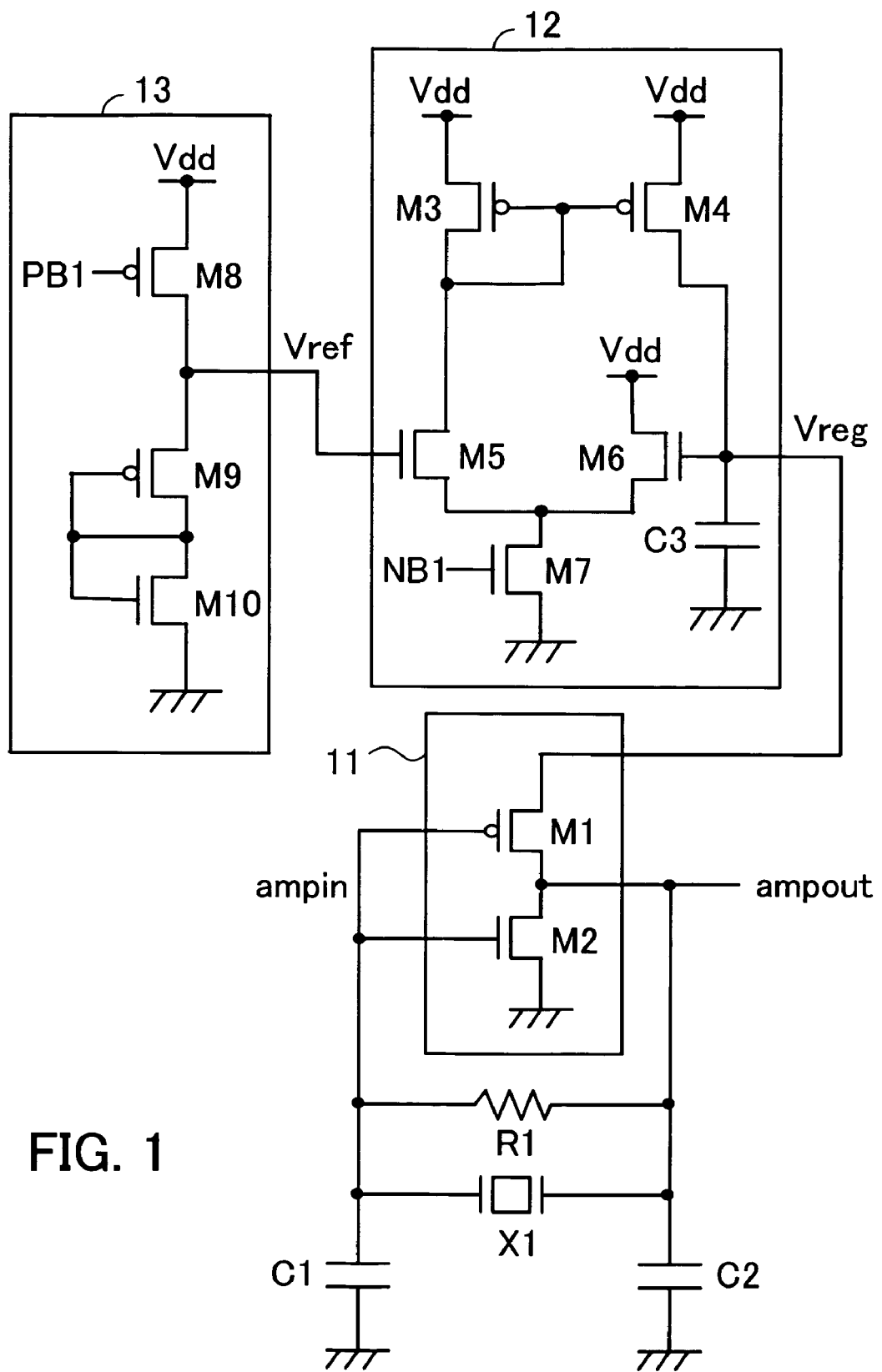
FIG. 1 is a circuit diagram showing a crystal oscillation circuit according to a first embodiment of the present invention.

Hereafter, the embodiments of the present invention will be described with reference to the accompanying drawings. FIG. 1 shows a crystal oscillation circuit according to a first embodiment of the present invention. As shown, the crystal oscillation circuit is arranged to have an oscillating amplifier 11, a constant voltage generator 12, a replica circuit 13, a resistor R1, capacitors C1 and C2, and a crystal oscillator X1. The oscillating amplifier 11 is composed of transistors M1 and M2. The constant voltage generator 12 is composed of PMOS transistors M3 and M4, NMOS transistors M5 to M7 and a capacitor C3. The replica circuit 13 is composed of PMOS transistors M8 and M9 and an NMOS transistor M10.

The transistors M1 and M2 composing the oscillating amplifier 11 operate to excite the resonator (positive feedback circuit) composed of the capacitors C1 and C2 and a crystal oscillator X1. The resistor R1 is a feedback resistor for specifying the operating points of the transistors M1 and M2.

The oscillating amplifier 11, the capacitors C1 and C2 and the crystal oscillator X1 compose the oscillation circuit, which oscillates the oscillation voltages ampin and ampout on a resonant frequency substantially defined by the crystal oscillator X1. The oscillating amplifier 11 amplifies a signal of the oscillation voltage ampin for keeping the oscillation and compensates for an energy loss caused by the crystal oscillator X1. The oscillating amplifier 11 is supplied with energy from the constant voltage Vreg and drives the capacitors C1 and C2 and the crystal oscillator X1. The constant voltage Vreg to be supplied to the oscillating amplifier 11 is adjusted so that the constant voltage may be large enough to keep the oscillation but may not be so large as suppressing increase of idle passage current.

The constant voltage generator 12 is inputted with the reference voltage Vref, generates the constant voltage Vreg and then supplies it to the oscillating amplifier 11. As shown in FIG. 1, the constant voltage Vreg is generated by the voltage follower having the reference voltage Vref as its input. The voltage follower generates a constant voltage Vreg of e.g. 1.3 V without depending upon the voltage of the power supply Vdd and then supplies the constant voltage Vreg to the oscillating amplifier 11. This makes it possible to prevent wasteful power consumption of the oscillating amplifier 11 as keeping the oscillation.

The transistors M9 and M10 of the replica circuit 13 are the MOS transistors in the same size as that of the transistor M1 or M2 of the oscillating amplifier 11. The gates and the drains of the transistors M9 and M10 are commonly connected with each other. These transistors are served as the inverter in which the input has the same potential as the output. This holds true to the state in which the transistors. M1 and M2 composing the oscillating amplifier 11 are made non-oscillatory. For example, since the oscillation does not grow immediately after the power supply is turned on, the oscillation voltages ampin and ampout-keep their potential same through the effect of the resistor R1. In this state, the current flows into the oscillating amplifier 11, which then starts the oscillation.

The gate of the transistor M8 included in the replica circuit 13 is inputted with a bias voltage PB1. The bias voltage. PB1 inputted into the gate causes the source of the transistor M8 to be conductive with the drain thereof. This results in making the reference voltage Vref equal to an addition of a threshold voltage of the transistor M9 and that of the transistor M10. When the reference voltage Vref is made equal in potential to the constant voltage Vreg, the current having the same value as the current flowing through the transistors M8 to M10 of the replica circuit 13 is caused to flow through the transistors M1 and M2 composing the oscillating amplifier 11.

The gate of the transistor M7 included in the constant voltage generator 12 is inputted with the bias voltage NB1 of the NMOS transistor and thus is served as a constant current source. The transistors M3 to M7 of the constant voltage generator 12 are served as a differential circuit. If the reference voltage Vref has a higher potential than the constant voltage Vreg, the transistor M5 causes current to be passed. This results in lowering the potentials of the drain of the transistor M3 and the gates of the transistors M3 and M4, thereby increasing the current being flown into the constant voltage Vreg. On the other hand, if the reference voltage Vref has a lower potential than the constant voltage Vreg, the current being flown through the transistor M5 is decreased and thereby the potentials of the drain of the transistor M3 and the gates of the transistors M3 and M4 are raised. This results in decreasing the current being flown into the constant voltage Vreg. This feedback action causes the reference voltage Vref to be closer in potential to the constant voltage Vreg.

By making the transistor M4 that supplies the oscillating amplifier 11 with load current have a longer gate width (W) than the transistor M4 paired with the transistor M3, and thereby a larger mirror ratio than the transistor M3, it is possible to increase load current to be supplied through the use of a one-stage differential circuit. The differential circuit composed of the transistors M3 to M7 is a one-stage differential circuit. Hence, if the capacitor C3 is located for suppressing transient fluctuation of the constant voltage Vreg, the phase lag does not exceed 90 degrees and does not reach 180 degrees. No phase compensation thus is necessary.

Unlike the conventional circuit, the crystal oscillation circuit of this embodiment does not need any phase compensation capacitance. This results in being able to reduce an occupation area of the relevant capacitor on the circuit. In comparing the circuit of this embodiment with the conventional circuit with respect to the circuit area, the area occupied by the phase compensation of the conventional circuit is used as an area of the capacitor C3 for output load. It means that a larger capacitance is allowed to be installed and the transient fluctuation of the constant voltage Vreg is suppressed accordingly.

In the crystal oscillation circuit shown in FIG. 1, of the transistors M3 to M7 composing the one-stage differential circuit, the drain of the transistor M6 whose gate is a reverse phase input terminal (−side) is connected with not the drain of the transistor M4 but the power supply Vdd. This connection causes tail current (current of the transistor M7) flowing through the transistor M6 whose gate is a minus side input to be flown from the power supply Vdd, not from the transistor M4. This allows all current of the transistor M4 to be flown into the oscillating amplifier 11.

Figure 10:
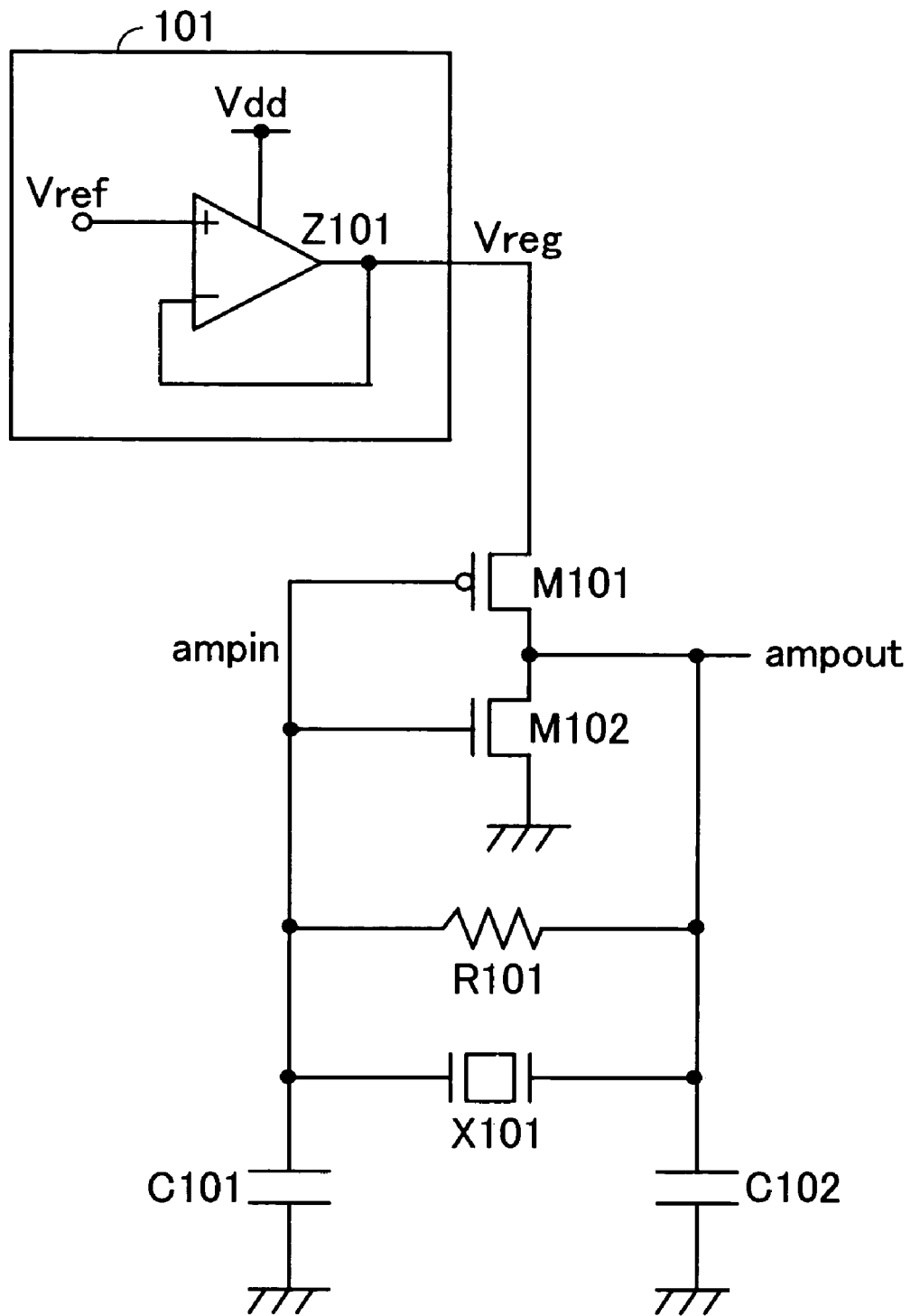
FIG. 10 illustrates a conventional first crystal oscillation circuit.
Figure 11:
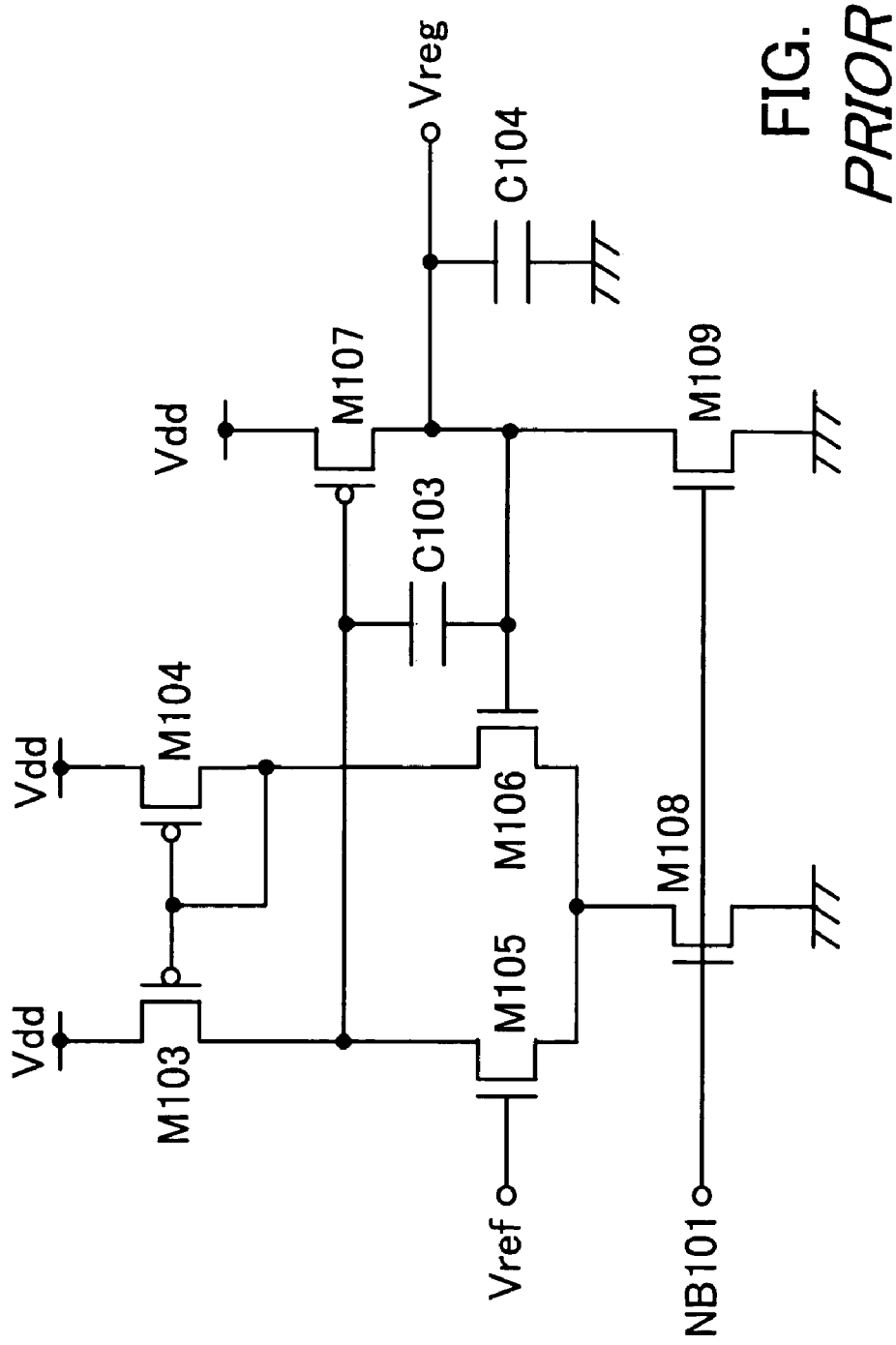
FIG. 11 illustrates an exemplary circuit of an operational amplifier composing a voltage follower included in the circuit shown in FIG. 10.
Figure 12:
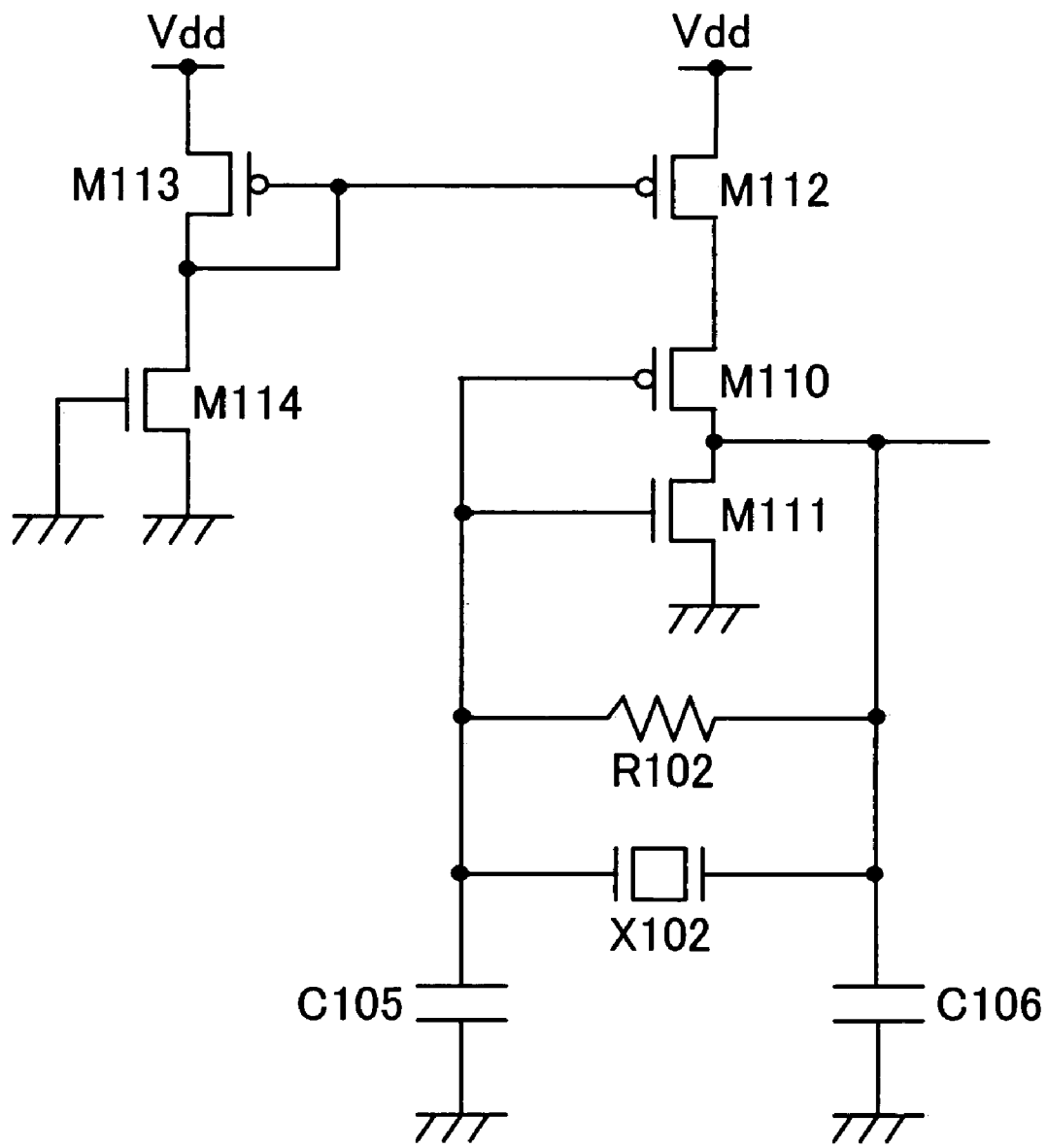
FIG. 12 illustrates a conventional second crystal oscillation circuit.
Figure 13:
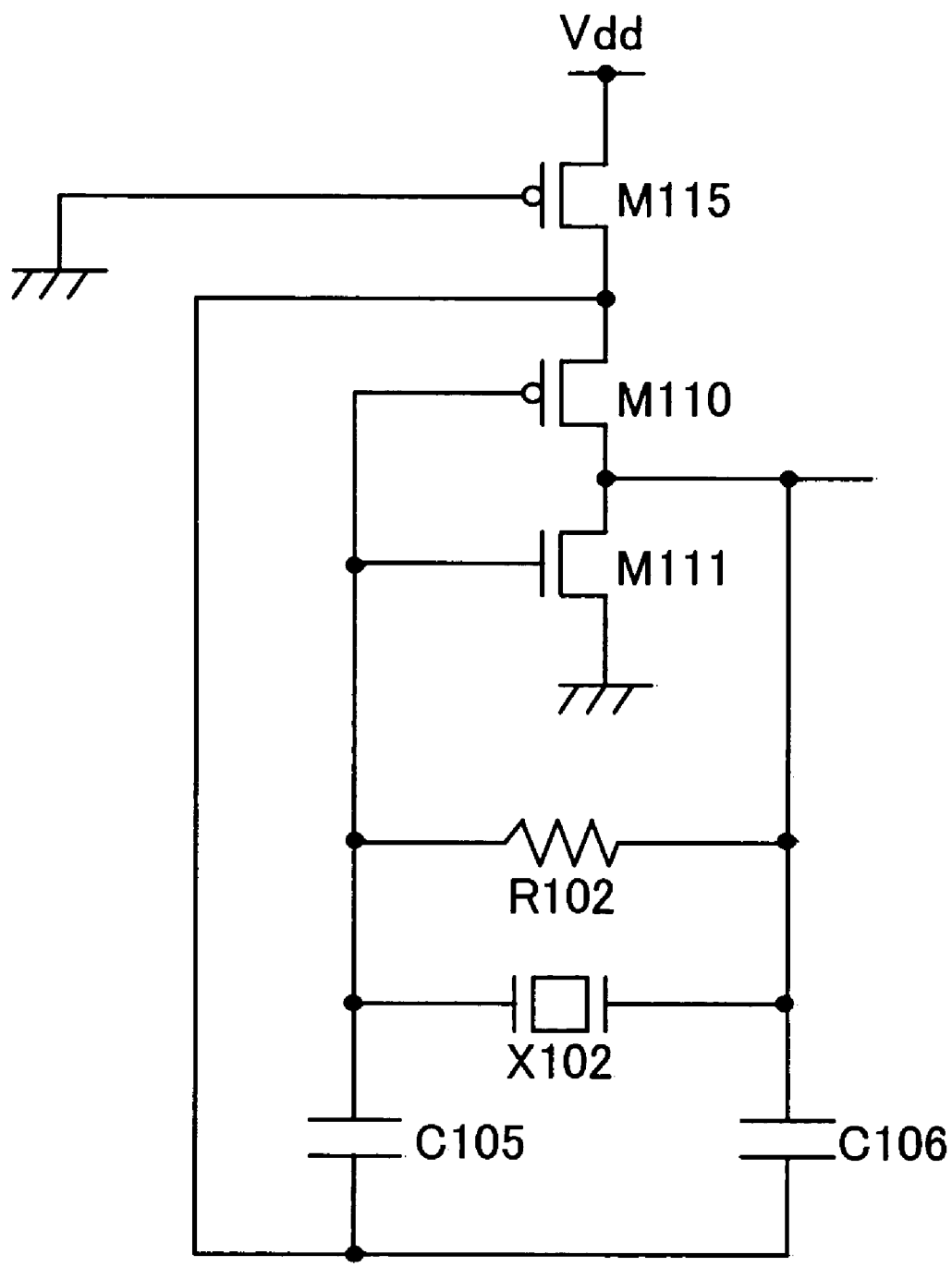
FIG. 13 illustrates a conventional third crystal oscillation circuit.

As described above with respect to the prior art, the voltage follower supplies the oscillating amplifier 11 with the constant voltage Vreg that is lower than the voltage of the power supply Vdd. This is because idle passage current is reduced as ensuring amplification factors of the transistors M1 and M2 composing the oscillating inverter being large enough to grow and keep the oscillation. That is, what is important is not absolute accuracy of the constant voltage Vreg but control of current. Unlike the conventional circuit, therefore, the present invention uses not a two-stage differential circuit but a one-stage differential circuit. If the passage current may be controlled as ensuring the amplification factors of the transistors M1 and M2 being large enough to grow and keep the oscillation, even by generating the constant voltage Vreg through the one-stage differential circuit, the lower power consumption is achieved. Further, since the two-stage differential circuit described with respect to the prior art has a high accuracy of setting the potential of the constant voltage Vreg but a low impedance of the constant voltage Vreg, for example, if the loss of the crystal oscillator is larger than the estimated loss, the constant voltage Vreg is allowed to supply the designed potential and the current to be consumed is increased accordingly. That is, in the circuits shown in FIGS. 10 and 11, since the constant voltage Vreg is set by the voltage of the power supply Vdd, the accuracy of setting the potential is higher. However, if the constant of each component is shifted, the power consumption is increased more greatly. Turning to the crystal oscillation circuit of the present invention, the current supplied by the transistor M4 does not exceed a current value defined by the mirror ratio of the transistors M4 and M3 and the transistor M7 composing the power supply and thus the maximum current is kept on the design.

For example, it is assumed that the current to be flown into the transistor M7 composing the current source is 0.1 μA and the mirror ratio of the transistors M3 and M4 is 10. (The gate width W of the transistor M4 is ten times as broad as W of the transistor M3.) If balanced when a loss of the crystal oscillator X1 is larger than estimated and the constant voltage Vreg is lower in potential than the reference voltage Vref, current of 0.1 μA at maximum is flown into the transistor M5, which allows current of 0.1 μA at maximum to be flown into the transistor M3. Hence, the circuit may be designed so that the maximum current to be flown into the transistor M4 is 1 μA. In the conventional circuit shown in FIG. 11, if the constant voltage Vreg is lower in potential than the reference voltage Vref, the voltage applied to the drains of the transistors M103 and M105 and the gate of the transistor M107 are amplified and thus is made lower accordingly. The maximum value of the current to be supplied cannot be considered in the design.

The current consumed when the oscillation reaches the steady state depends upon not only the passage currents of the transistors M1 and M2 composing the oscillating inverter but also the loss of the crystal oscillator X1. Hence, if the current assumed when the oscillation reaches the steady state is set on the ideal supply current in the design, when starting the oscillation, the circuit so designed does not supply a sufficient amount of bias current.

In a case that the final current consumed in the steady state is approximated by the passage current of the transistors M1 and M2 and the current for compensating for a loss of the crystal oscillator X1 or the like, even in the same constant voltage Vreg, the current flowing when starting the oscillation may be smaller than the final current because no loss of the crystal oscillator X1 or the like takes place. Hence, if like the prior circuit the substantially ideal voltage source is designed with an amplifier with a high gain as targeting the final consumed current and the potential of the constant voltage Vreg is set on that voltage source, the final consumed current is smaller than the bias current in starting the oscillation.

For example, for alleviating this disadvantage, the circuit disclosed in the Japanese Unexamined Patent Publication No. 04-94201 takes a measure of raising the potential of the constant voltage Vreg in starting the oscillation higher than that of the constant voltage Vreg in the steady state. On the other hand, the crystal oscillation circuit of this invention provides a capability of increasing the bias current in starting the oscillation in advance because of the following respects. Though the constant voltage Vreg is made lower according to the growth of the oscillation and the increase of the loss of the crystal oscillator X1 or the like, the circuit does not serve to forcibly match the constant voltage Vreg with the reference voltage Vref in potential since the amplifier does not have so large a voltage gain, so the current is gradually increased. Further, the maximum current may be designed on the mirror ratio, so that the circuit may be designed to have so large a bias current in starting the oscillation as bringing about no problem.

As described above, in the present invention, the removal of the capacitor for phase compensation through the use of the one-stage differential circuit makes it possible to simplify the circuit arrangement and reduce the circuit area. The circuit of this invention enables to lower the power consumption and offer the stable oscillation.

Figure 2:
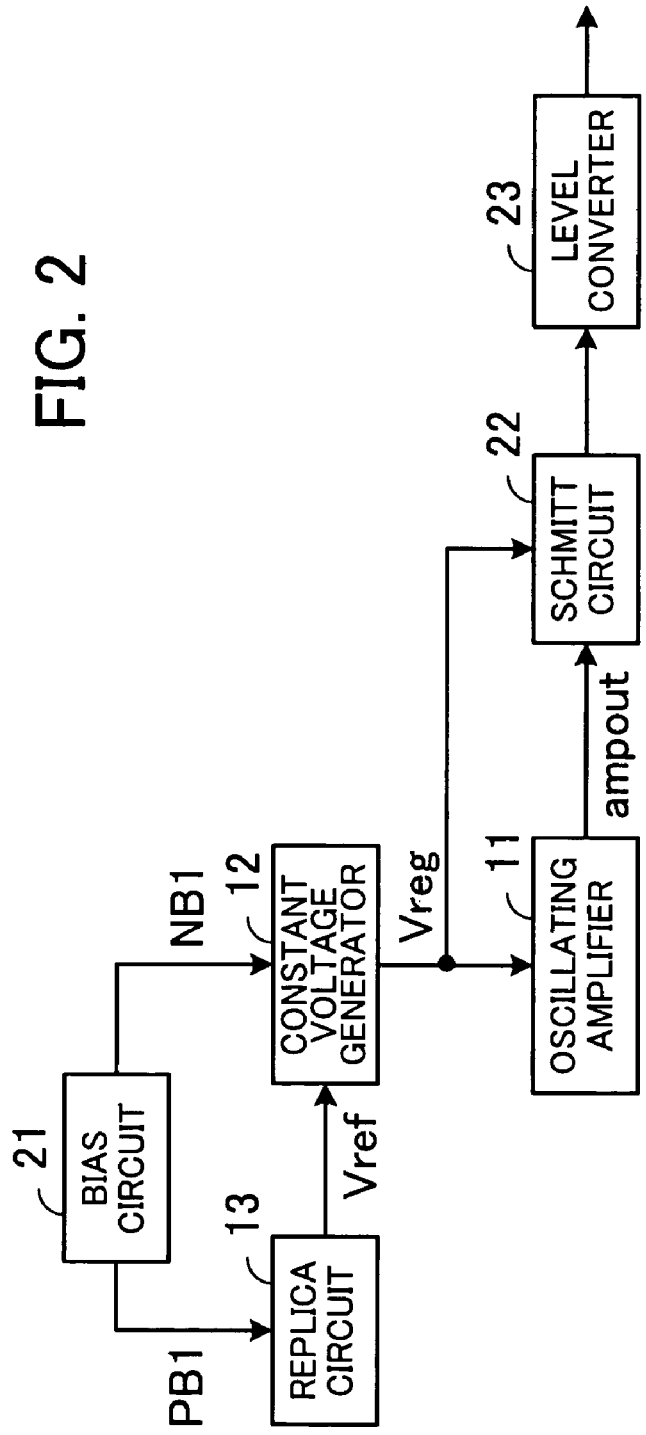
FIG. 2 is a block diagram showing an oscillation circuit to which the crystal oscillation circuit shown in FIG. 1 is applied.

In turn, the description will be oriented to the oscillation circuit to which the crystal oscillation circuit shown in FIG. 1 is applied. FIG. 2 is a block diagram showing that oscillation circuit. As shown, the oscillation circuit is arranged to have an oscillating amplifier 11, a constant voltage generator 12, a replica circuit 13, a bias circuit 21, a Schmitt circuit 22, and a level converter 23. The oscillating amplifier 11, the constant voltage generator 12 and the replica circuit 13 are the same as those shown in FIG. 1 and thus are not described herein. In addition, as shown in FIG. 1, in actual, the resistor R1, the capacitors C1 and C2, and the crystal oscillator X1 are connected with the oscillator amplifier 11. In FIG. 2, however, those connected components are not shown.

The bias circuit 21 generates the bias voltage PB1 shown in FIG. 1 and supplies the replica circuit 13 with the bias voltage PB1. Further, the bias circuit 21 generates the bias voltage NB1 shown in FIG. 1 and supplies the constant voltage generator 12 with the bias voltage NB1. The Schmitt circuit 22 is inputted with the constant voltage Vreg outputted from the constant voltage generator 12. Further, the Schmitt circuit 22 is inputted with the amplified voltage ampout outputted from the oscillating amplifier 11. The Schmitt circuit 22 shapes the waveform of the amplified voltage ampout and then outputs the shaped voltage to the level converter 23. The level converter 23 converts the level of the signal from the Schmitt circuit 22 into the voltage level of the power supply Vdd.

Figure 3:
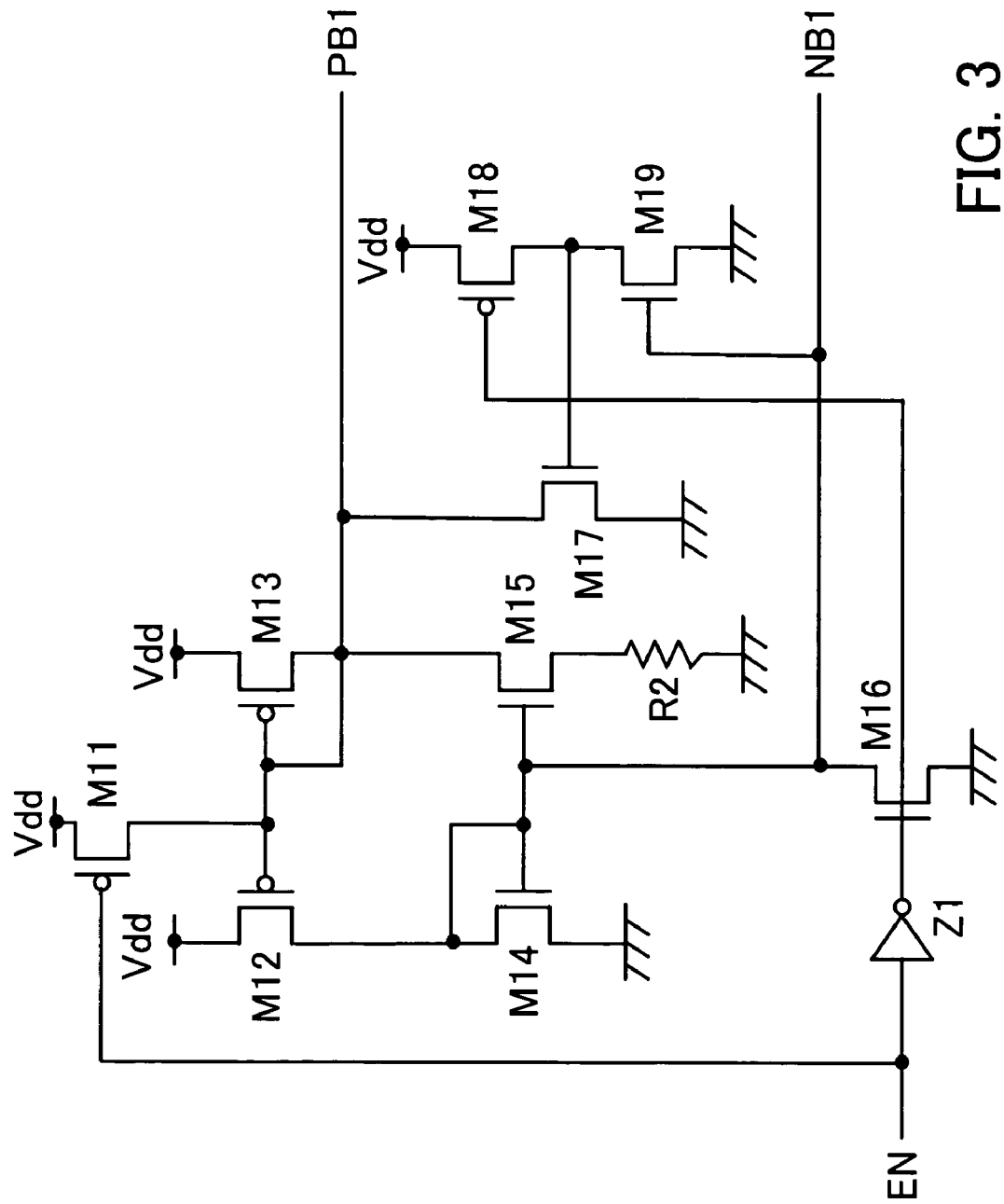
FIG. 3 is a circuit diagram showing a bias circuit included in the circuit shown in FIG. 2.

The bias circuit 21 will be described in detail. FIG. 3 shows the bias circuit. As shown, the bias circuit 21 includes PMOS transistors M11 to M13 and M18, NMOS transistors M14 to M17 and M19, a resistor R2, and an inverter Z1.

When the control signal EN inputted into the inverter Z1 is at "H" (High) level, the bias voltages PB1 and NB1 are generated. The transistors M14 and M15 are sized so that they are operated in the sub-threshold region. In the sub-threshold region, the drain current ID is in proportion to an exponential function of the gate voltage Vgs and is roughly represented by the following expression (1):

$$ID = Io \exp(qVgs/nkT) \quad (1)$$

wherein q is electron charges, n is a proportionality constant (about 1.3), Vgs is a voltage between the gate and the source, k is a Boltzmann constant, T is an absolute temperature, ID is a drain current, and Io is a proportionality constant.

For example, it is assumed that a W ratio of the transistor M14 to the transistor M15 is 5 (W of the transistor M15/W of the transistor M14=5) and the transistors M12 and M13 are sized in a similar manner. Since the same amount of current is flown through the transistors M12 and M13, the same amount of current is flown through the transistors M14 and M15. Hence, the bias circuit is balanced. Assuming that the W ratio of the transistor M14 to the transistor M15 is 5, the flowing current is represented by the following expression (2):

$$ID = ((nkT/q)\ln(5))/R2 \quad (2)$$

wherein R2 is a resistance of the resistor R2.

This expression indicates that the flowing current is designed by the constant ln (5) defined by the thermal voltage kT/q and the size ratio and the resistance of the resistor R2. Excepting the secondary effects, the flowing current is determined without depending on the voltage of the power supply Vdd and the MOS transistor (wherein assuming that the resistor R2 does not depend on the temperature, ID is in proportion to T).

The transistors M17 to M19 are served as a startup circuit. The loop circuit composed of the transistors M12 to M15 has a stable point where no current appears in addition to the stable point represented by the expression (2). In order to avoid this unwanted stable point, when no current flows through the transistors M14 and M15 and no bias voltage NB1 appears, the potentials at the drains of the transistors M18 and M19 are made to be the voltage of the power supply Vdd, so that the initial current is allowed to be flown by the transistor M17. When current flows through the transistors M14 and M15 and the bias voltage NB1 appears, current flows through the transistor M19, so that the potentials at the drains of the transistors M18 and M19 become the ground potential and thereby the startup circuit is separated.

When the control signal EN reaches the "L" (Low) level, the transistor M18 becomes off, so that no current flows through the startup circuit. Further, the bias voltage PB1 is made equal to the voltage of the power supply Vdd and the bias voltage NB1 is made zero. No current thus flows through each component. And, the circuits that have been already supplied with the bias voltages PB1 and NB1 are controlled to prevent flow of current.

Figure 4:
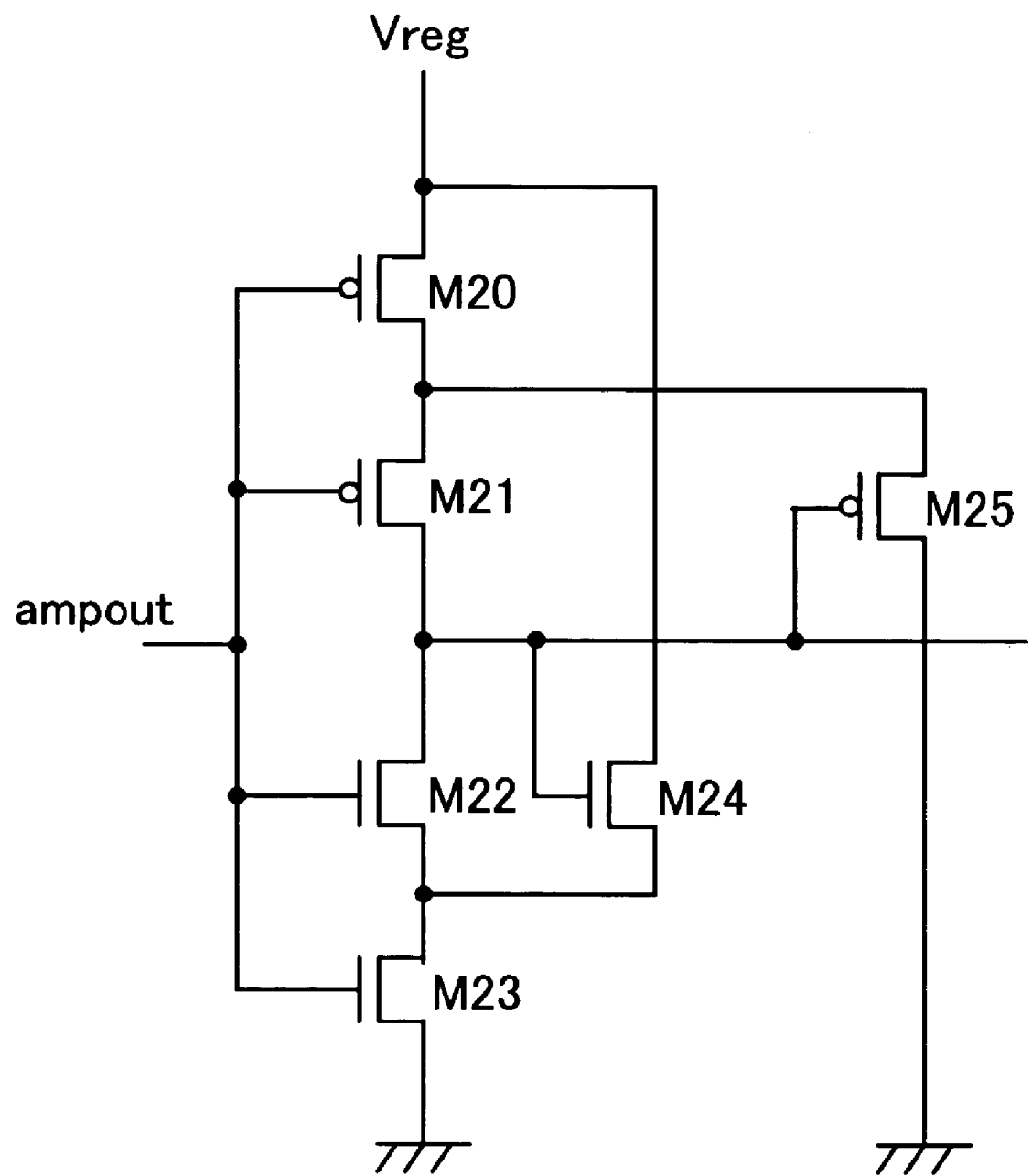
FIG. 4 is a circuit diagram showing a Schmitt circuit included in the circuit shown in FIG. 2.

The Schmitt circuit 22 will be described in detail. FIG. 4 shows the Schmitt circuit shown in FIG. 2. As shown, the Schmitt circuit 22 includes PMOS transistors M20, M21 and M25 and NMOS transistors M22 to M24.

The gates of the transistors M20 to M23 are inputted with the oscillation voltage ampout. The constant voltage Vreg is inputted into the source of the transistor M20 and the drain of the transistor M24. The Schmitt circuit 22 shapes the oscillation voltage ampout and outputs the shaped voltage.

In the meantime, in general, the crystal oscillation circuit used for a clock included in a MCU (Micro Controller Unit) has an oscillation frequency of 32768 Hz (32 kHz). The period is about 30.5 µs. In the circuit described with reference to FIGS. 10 and 11, assuming that the average current of the oscillating inverter is about 1 µA, the peak current of the oscillating inverter in operation exceeds 2 µA. Assuming that the peak current of the oscillating inverter flows during a quarter period, the charges given by the current reaches 2 µA×30.5 µs×¼=15.3 pC. In order to enable supply of average current, the voltage follower shown in FIG. 11 carries out a feedback function so that the potentials at the drains of the transistors M103 and M105 are defined. Hence, more current than the average current is supplied by the capacitor C104 for stabilizing the output potential. The amount of charges supplied by the capacitor C104 reach 1 µA×30.5 µs×¼=7.6 pC. When the transient fluctuation of the constant voltage Vreg is great, transiently, the constant voltage Vreg lowers its potential. For keeping the oscillation at the lower potential, therefore, it is necessary to set the reference voltage Vref to a higher value. This leads to increasing the consumption of an electric power, so it is preferable to suppress the transient fluctuation of the potential of the constant voltage Vreg. For example, if, in the foregoing values, the potential drop of the constant voltage Vreg is suppressed as about 0.2 V, the required capacitance becomes 7.6 pC/0.2 V=38 pF. This value is too large to be filled by the parasitic capacitance in the integrated circuit. Hence, this large value needs a dedicated capacitance.

If the capacitor C104 with such a large capacitance as described is located in the output of the voltage follower, it is necessary to provide the phase compensation capacitor C103 with at least several pF capacitance. For keeping the accuracy of the potential of the constant voltage Vreg, it is necessary to provide the capacitor C104 for suppressing the transient fluctuation of the potential and the phase compensation capacitor C103. On the other hand, in the present invention, the use of a one-stage differential circuit results in removing the phase compensation capacitor and making the circuit arrangement simpler and the area smaller. Hence, the crystal oscillation circuit of the present invention enables to offer the stable oscillation at low power consumption.

Figure 5:
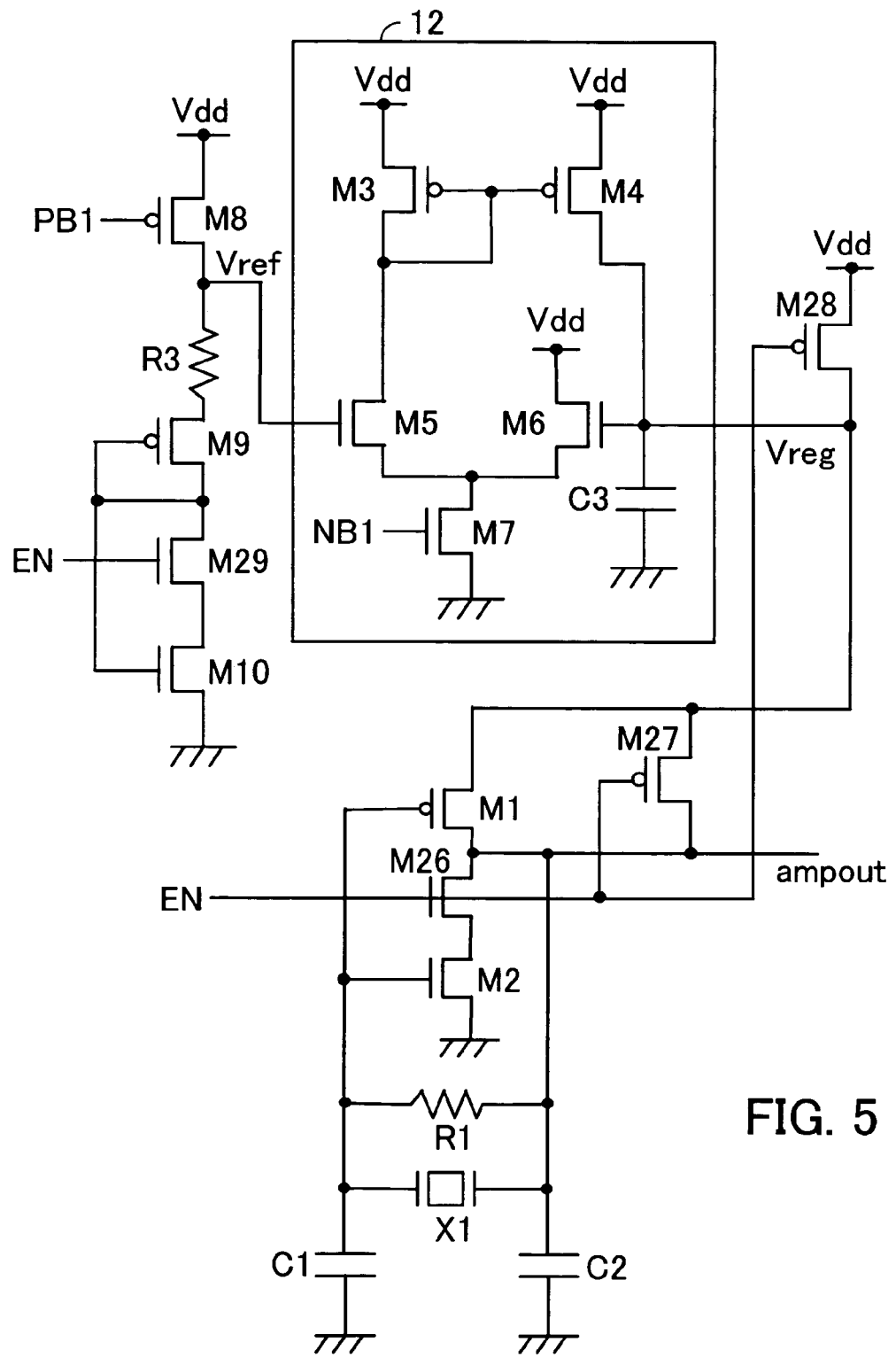
FIG. 5 is a circuit diagram showing a crystal oscillation circuit according to a second embodiment of the present invention.

In turn, the description will be oriented to the crystal oscillation circuit according to the second embodiment of the present invention. FIG. 5 shows the crystal oscillation circuit of the second embodiment. This circuit is arranged so that no current flows through each component when the oscillation is stopped. In FIG. 5, the same components as those shown in FIG. 1 have the same reference numbers and the description thereabout is left out.

As shown in FIG. 5, a transistor M26 is connected between the drains of the transistors M1 and M2. A transistor M27 is connected between the source and the drain of the transistor M1. A transistor M28 is connected between the power supply Vdd and the sources of the transistors M1 and M27. The gates of the transistors M26 to M28 are inputted with a control signal EN. A resistor R3 is connected between the drain of the transistor M8 and the source of the transistor M9. A transistor M29 is connected between the transistors M9 and M10.

The crystal oscillation circuit shown in FIG. 5 oscillates when the control signal EN is at the "H" level. At the high control signal EN, the transistor M26 becomes on and the transistors M27 and M28 become off. Hence, the crystal oscillation circuit shown in FIG. 5 is operated in a similar manner to the crystal oscillation circuit shown in FIG. 1. At the low control signal EN, the transistor M26 becomes off and the transistors M27 and M28 become on. Hence, the constant voltage Vreg is made equal in potential to the power supply Vdd. Further, since the transistor M27 is also turned on, the potential of the oscillation voltage ampout is made equal to the voltage of the power supply Vdd. Since the transistor M26 is turned off, by cutting off the resistor R1 with a switch, no current is allowed to flow through, the transistors M1 and M2, the capacitors C1 and C2 and the crystal oscillator X1 even if the oscillation voltage ampin has any potential value.

Also in the replica circuit for generating the reference voltage Vref and composed of the transistors M8 to M10 and M29 and the resistor R3, when the control signal EN is at the "H" level, the transistor M29 is turned on. Hence, the replica circuit has an input and output served as the inverter at the same potential. When the control signal EN is at the "H" level, the transistor M29 is turned off, so that no current flows therethrough.

In the description about the crystal oscillation circuit shown in FIG. 1, it is assumed that the transistors M9 and M10 of the replica circuit 13 are the similarly sized MOS transistors to the transistors M1 and M2 of the oscillating amplifier 11. This is valid in the circuit operation. In this case, however, the current flowing through the replica circuit 13 has the same value as the current flowing through the transistors M1 and M2 of the oscillating amplifier 11 when starting the oscillation. That is, when starting the oscillation, the same current as the current flowing through the transistors M1 and M2 of the oscillating amplifier 11 is consumed in the replica circuit 13. For stably starting the oscillation, thee current flowing through the transistors M1 and M2 of the oscillating amplifier 11 cannot be smaller than a certain value. For reducing the power consumption of the overall circuit, it is necessary to make the current flowing through the replica circuit 13 smaller.

For that purpose, in the crystal oscillation circuit shown in FIG. 5, the replica circuit is composed of the transistors M8 to M10 and a resistor R3 connected in series therewith. The current flown from the transistor M8 causes the potential of the reference voltage Vref to be equal to a total of a threshold voltage of the transistor M9 and threshold voltages of the transistors M29 and M10 both of which are dropped by the resistor R3. On the same voltage level, the potential of the reference voltage Vref is made higher than that of the crystal oscillation circuit shown in FIG. 1 by the voltage drop caused by the resistor R3. This makes it possible to generate such a reference voltage Vref as flowing proper current through the oscillating amplifier (transistors M1, M2 and M26), even if the current to be flown through the replica circuit is reduced.

In a case that the resistor R3 is used for generating the reference voltage Vref with a smaller amount of current, the replica circuit composed of the transistors M9, M29 and M10 and the resistor R3 is not a complete replica of the transistors M1, M26 and M2 composing the oscillating amplifier. Hence, the current flowing through the replica circuit is different from the current flowing through the oscillating amplifier. However, as stated above with reference to FIG. 1, the constant voltage generator 12 enables to design the maximum current of the oscillating amplifier if the current is not completely matched to the actual current though the complete match therebetween is simulated. Hence, the target current is not greatly shifted from the actual current.

As described above, the voltage follower composed of a one-stage amplifier allows a maximum current to be easily designed. This makes it possible to realize the characteristic in which the power is not greatly increased if the actual consumed current is somewhat shifted from the designed value. Through the use of this characteristic, by adding the resistor R3 to the replica circuit, the crystal oscillation circuit according to the second embodiment enables to reduce the current flowing through the replica circuit.

Like the crystal oscillation circuit according to the first embodiment, the crystal oscillation circuit according to the second embodiment may be used in combination with the bias circuit 21, the Schmitt circuit 22, and the level converter 23.

Figure 6:
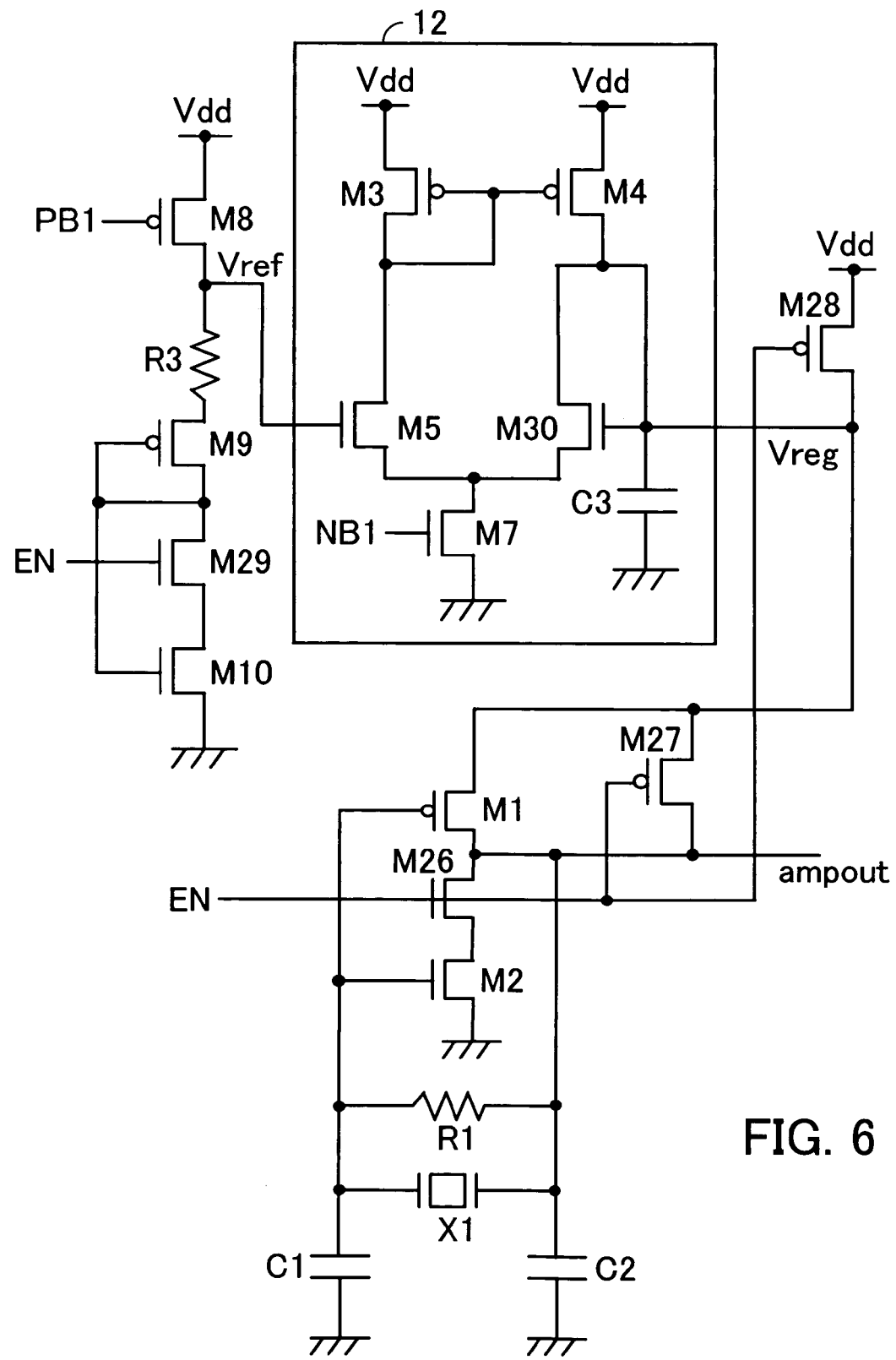
FIG. 6 is a circuit diagram showing a crystal oscillation circuit according to a third embodiment of the present invention.

In turn, the description will be oriented to the crystal oscillation circuit according to a third embodiment of the present invention. FIG. 6 shows this crystal oscillating circuit. In the crystal oscillation circuit, the drain of the transistor M6 included in the circuit shown in FIG. 5 is inputted with not the voltage from the power supply Vdd but the constant voltage Vreg. In FIG. 6, the same components as those shown in FIG. 5 have the same reference numbers and are not described herein.

As shown in FIG. 6, the drain of the NMOS transistor M30 is connected with the drain of the transistor M4. The source of the transistor M30 is connected with the source of the transistor M5 and the drain of the transistor M7. The gate of the transistor M30 is connected with the drain of the transistor M4, the capacitor C3 and the drain of the transistor M28.

Also, the crystal oscillation circuit shown in FIG. 6 is different from the circuit shown in FIG. 5 in a respect that the constant voltage Vreg is supplied to the drain of the transistor M30. If the reference voltage Vref comes closer to the constant voltage Vreg in FIG. 6, the same amount of current is flowing through both the transistors M5 and M30. Hence, the current supplied by the transistor M4 to the transistors M1 and M2 composing the oscillating amplifier is reduced accordingly. If, therefore, the reduction of the current is negligible, the circuit may be rearranged so that the constant voltage Vreg is supplied to the drain of the transistor M30 as shown in FIG. 6.

The other arrangement of FIG. 6 is the same as that of the crystal oscillation circuit shown in FIG. 5 and thus is not described. The crystal oscillation circuit shown in FIG. 6 may be also used in combination with the bias circuit 21, the Schmitt circuit 22 and the level converter 23 shown in FIG. 2.

Figure 7:
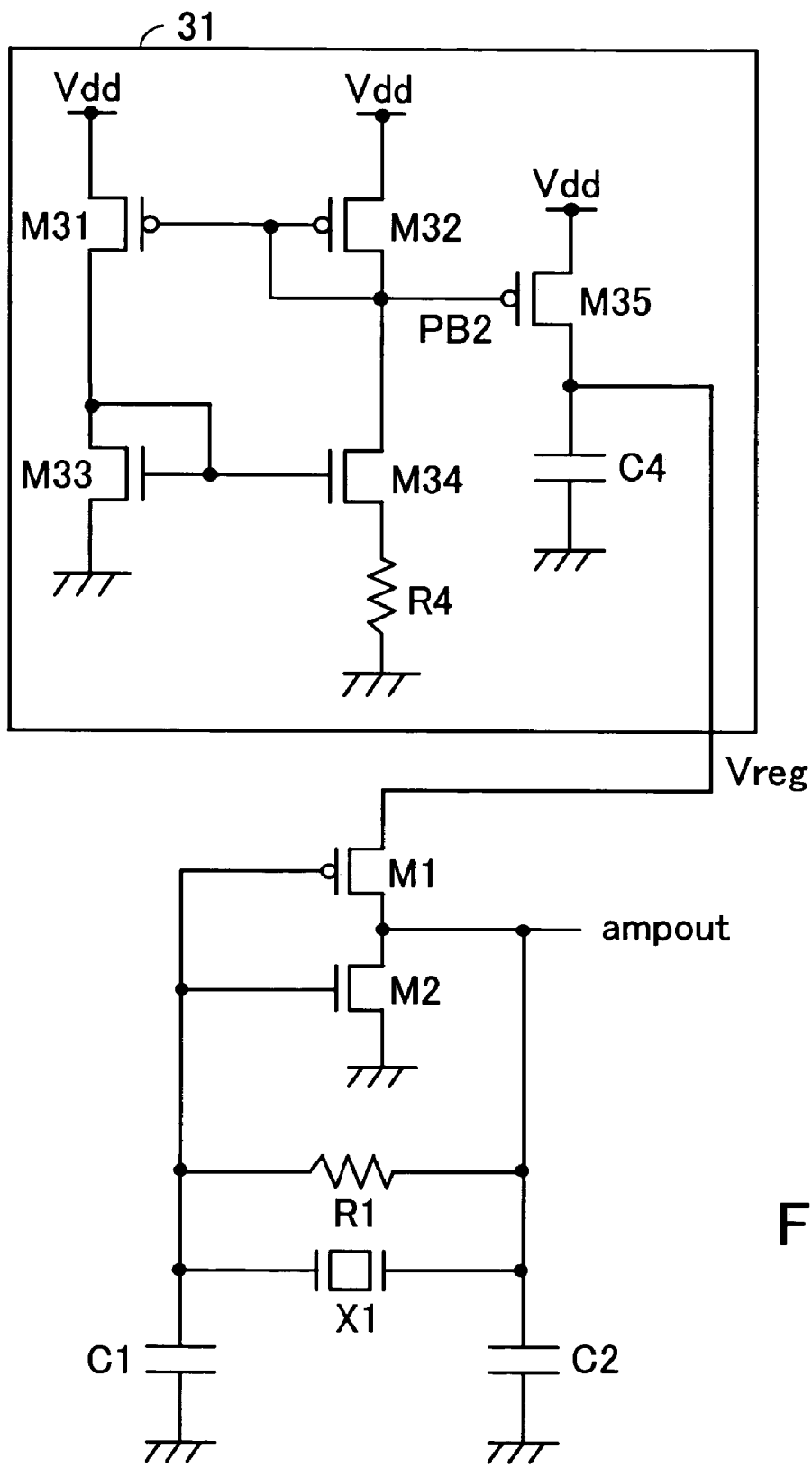
FIG. 7 is a circuit diagram showing a crystal oscillation circuit according to a fourth embodiment of the present invention.

In turn, the description will be oriented to the crystal oscillation circuit according to the fourth embodiment of the present invention. FIG. 7 shows this crystal oscillation circuit. In FIG. 7, the same components as those shown in FIG. 1 have the same reference numbers and are not described herein.

As shown in FIG. 7, the constant voltage generator 31 is composed of PMOS transistors M31, M32 and M35, NMOS transistors M33 and M34, a resistor R4, and a capacitor C4.

The constant generator circuit 31 is operated in a similar manner to the bias circuit shown in FIG. 3. However, the circuit portion about the control signal EN and the startup circuit portion are removed from FIG. 7 for simplifying the drawing. The current flowing through the gate of the transistor M35 may be designed on a thermal voltage $kT/q$, a size ratio and a resistance of the resistor R4. Excepting the secondary effects, the current is defined without depending on the voltage of the power supply Vdd and the MOS transistor (in which assuming that the resistor R4 does not depend on the temperature, the current is in proportion to T).

The bias voltage PB2 generated at the drains of the transistors M32 and M34 is supplied to the gate of the transistor M35. The constant voltage Vreg outputted from the drain of the transistor M35 is supplied to the transistors M1 and M2 composing the oscillating amplifier. In a case that the oscillation is grown up or kept in the steady state, the potentials of the oscillation voltages ampin and ampout are oscillated and the current flowing through the transistor M1 is subject to the transient great fluctuation accordingly. For suppressing the transient potential fluctuation, the capacitor C4 is provided. The required capacitance of the capacitor C4 is 38 pF assuming that in the numeric values described with respect to the first embodiment the average current of the oscillating inverter is about 1 μA and the potential transient fluctuation of the constant voltage Vreg is about 0.2 V.

In the crystal oscillation circuit shown in FIG. 7, the use of the transistors M31 to M34 with the thermal voltage as the reference and the resistor R4 makes it possible to overcome the disadvantages such as a manufacturing variation of MOS transistors and great dependency of a bias current on a supply voltage.

Further, in the crystal oscillation circuit shown in FIG. 7, the potential of the constant voltage Vreg is defined as the voltage at which the average current of the transistors M1 and M2 composing the oscillating amplifier is balanced with the current of the transistor M35. For example, assuming that the current of the transistor M35 is 1 μA and the potential of the constant voltage at that current is 1.5 V, the potential of the constant voltage Vreg is 1.5 V even if the voltage of the power supply Vdd is 3 V or 2 V.

Figure 14:
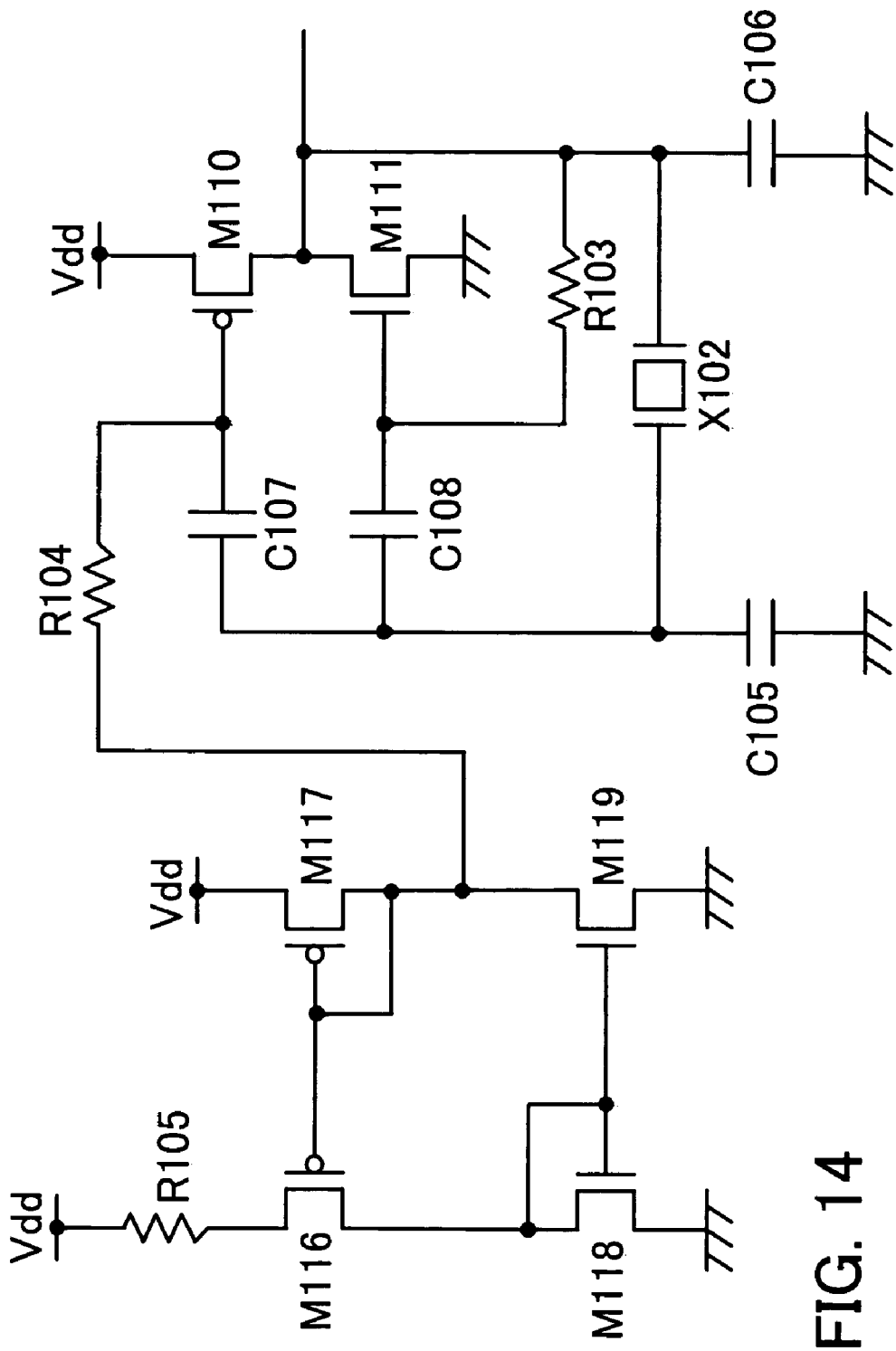
FIG. 14 illustrates a conventional fourth crystal oscillation circuit.

The crystal oscillation circuit described with reference to FIG. 14 adopts the bias circuit with a thermal voltage as its reference (which circuit is composed of the transistors M116 to M119 and the resistor R105). In the circuit, however, the amplitude of the oscillation voltage ampout depends on the voltage of the power supply Vdd. For composing the overall circuit with the Schmitt circuit and the level converter combined therewith, it is preferable to fine control the amplitude of the oscillation voltage ampout. For that purpose, the crystal oscillation circuit shown in FIG. 14 has been required to supply a constant voltage of the power supply Vdd. Turning to the crystal oscillation circuit of the present invention shown in FIG. 7, the constant voltage generator 31 is a circuit composed of a transistor M35, a capacitor C4, transistors M31 to M34 for defining current on a thermal voltage and a resistance, and a resistor R4, and the oscillating amplifier is composed of CMOS transistors M1 and M2. This composition makes it possible to realize a simply arranged constant voltage generator.

The circuit shown in FIG. 7 may be also used in combination with the bias circuit 21, the Schmitt circuit 22 and the level converter 23 shown in FIG. 2. In FIG. 7, like the crystal oscillation circuit shown in FIG. 5, each component may be controlled so that current may not be flown therethrough with the control signal EN.

Herein, the description will be oriented to the comparison between the crystal oscillation circuit shown in FIG. 1 and that shown in FIG. 7. In the circuit shown in FIG. 1, the constant voltage generator 12 is composed of a one-stage differential circuit (composed of the transistors M3 to M7). The use of the one-stage differential circuit eliminates the necessity of the phase compensation capacitor. Turning to the crystal oscillation circuit shown in FIG. 7, the constant voltage generator 31 is composed of the transistor M35 and the capacitor C4 that flow constant current in concert and a bias circuit with a thermal voltage as its reference (composed of the transistors M31 to M34 and the resistor R4), and the oscillating amplifier is composed of the CMOS transistors M1 and M2.

Since the constant voltage generator 12 shown in FIG. 1 uses a one-stage differential circuit, if the capacitance of the capacitor C3 is reduced to some degree, it is expected that the circuit is functioned to keep the potential of the constant voltage Vreg constant by virtue of the feedback effect. On the contrary, the circuit is required to generate the reference voltage Vref through the replica circuit 13 and the current consumed in the circuit is increased according to the current consumed by this replica circuit.

The constant voltage generator 31 shown in FIG. 7 is composed of the transistor M35 and the capacitor C4 which flow constant current in concert. Hence, the circuit 31 does not need to locate the replica circuit for generating the reference voltage Vref. It means that principally no current consumed in the replica circuit takes place, so the circuit 31 is fitted to the design with a reduced power. Further, since the current consumed in the oscillating amplifier (composed of the transistors M1 and M2) is substantially equal to the current of the transistor M35, the overall consumed current is designed directly on the current of the transistor M35. This leads to easier design of the overall consumed current. On the contrary, since the constant voltage generator 31 composed of the combination of the constant current source and the capacitance does not have an amplification function of a voltage, if the bias current is reduced on the lower voltage side of the power supply Vdd, it directly leads to reduction of the bias current in the oscillating amplifier. This reduction possibly impairs the stable start of oscillation. Hence, this constant voltage generator is required to be combined with the bias circuit as shown in FIG. 3 or 7 that does not reduce the bias current if the voltage of the power supply Vdd is lower. Further, the constant voltage generator 31 does not have such a feedback effect as suppressing the fluctuation of the constant voltage Vreg. It means the capacitor C4 with a sufficiently large capacitance has to be prepared.

That is, in the crystal oscillation circuit shown in FIG. 1, if the capacitance of the capacitor C3 is reduced to some degree, no great influence is given to the action. Hence, the circuit shown in FIG. 1 is fitted to the case of reducing the capacitance area for reducing the cost. As compared with the circuit shown in FIG. 1, the crystal oscillation circuit shown in FIG. 7 needs to prepare the capacitor C4 with a larger capacitance. Hence, the overall area is made larger than that of the circuit shown in FIG. 1 and thus the circuit shown in FIG. 7 is more costly. However, the power of the replica circuit 13 is reduced from the circuit of FIG. 7. Hence, the circuit shown in FIG. 7 is fitted for the case that priority is placed on the low power consumption characteristic.

As described above, the crystal oscillation circuit shown in FIG. 7 reduces the manufacturing variation of transistors and dependency of itself on a supply voltage and may be realized with a low power-consumed and simple circuit arrangement.

Figure 8:
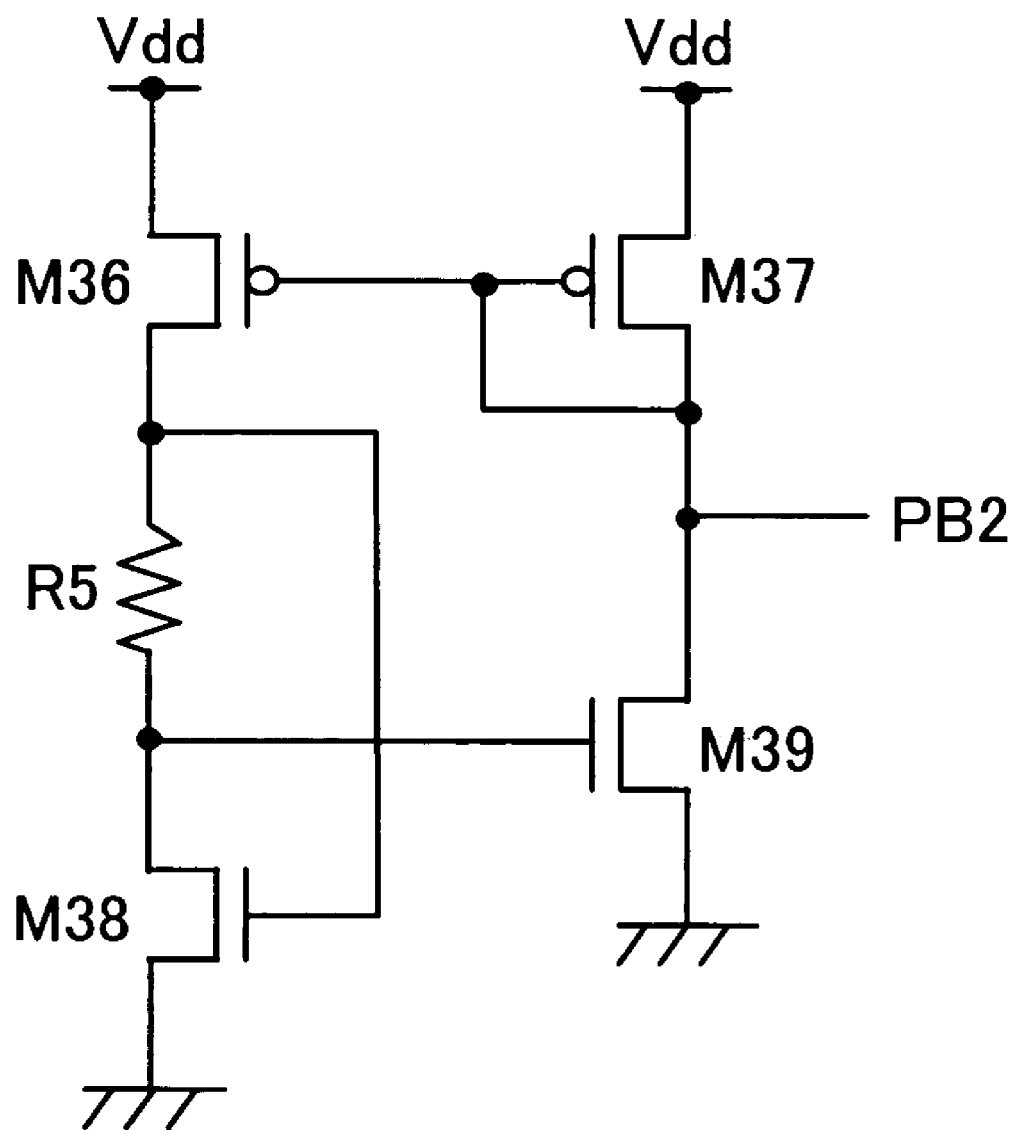
FIG. 8 illustrates another first circuit of the bias circuit.

In turn, another arrangement of the bias circuit will be described. FIG. 8 shows another first circuit arrangement of the bias circuit. As shown, the bias circuit includes PMOS transistors M36 and M37, NMOS transistors M38 and M39, and a resistor R5. The bias voltage PB2 is supplied to the gate of the transistor M35 shown in FIG. 7.

Like the bias circuit shown in FIG. 3, the current flowing through the transistors M37 and M39 is designed on a constant defined by a thermal voltage kT/q and a size ratio and a resistance of the resistor R5. The gate voltage of the transistor M39 is lower than that of the transistor M38 by a drain current ID×R5 (resistance of the resistor R5). The transistors M38 and M39 are sized to operate in the subthreshold region. Assuming the transistors M36 and M37 are sized similarly, the current flowing through the transistor M38 is made equal to the current flowing through the transistor M39. Assuming that the W ratio of the transistor M38 to the transistor M39 is (gate width W of transistor M39/gate width W of transistor M38=5), the circuit is balanced at a point where the transistors M38 and M39 have the same amount of current flown therethrough. Considering the foregoing expression (1) and the W ratio of 5 between the transistors M38 and M39, the flowing current is represented by the following expression (3):

$$ID((nKT/q)ln(5))/R5 \qquad (3)$$

(wherein q is electron charges, n is a proportionality constant (about 1.3), k is a Boltzmann constant, T is an absolute temperature, and ID is a drain current.)

It means that the flowing current is designed on the constant ln (5) defined by the thermal voltage kT/q and the size ratio and the resistance of the resistor R5. Excepting the secondary effects, the current is defined without depending on the supply voltage and the MOS transistor, (in which assuming that T5 does not depend on a temperature, ID is proportion to T).

That is, this bias circuit enables to stably output the bias voltage without depending on the manufacturing variation of MOS transistors and the supply voltage.

Figure 9:
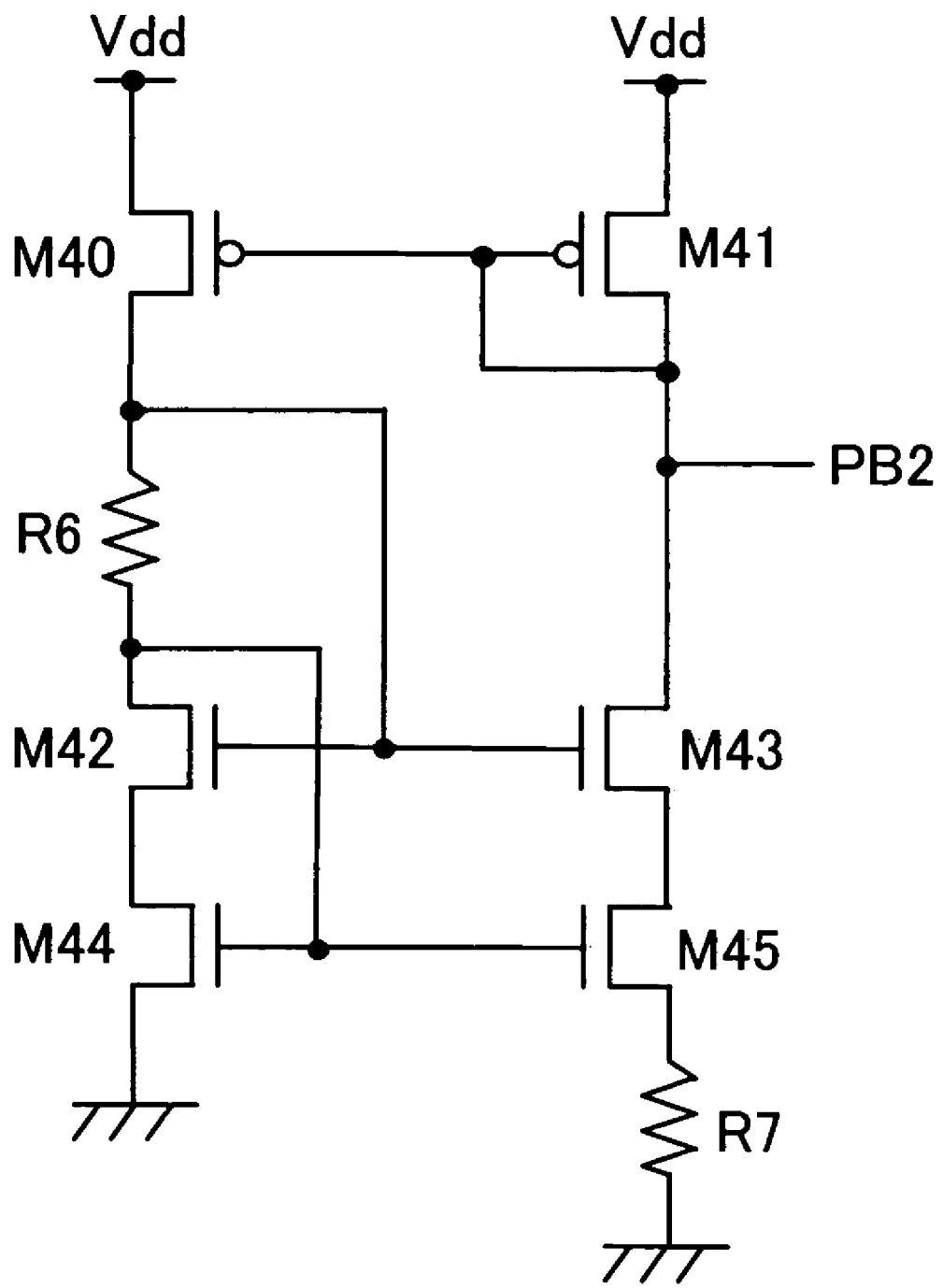
FIG. 9 illustrates another second circuit of the bias circuit.

FIG. 9 shows another second arrangement of the bias circuit. As shown, the bias circuit includes PMOS transistors M40 and M41, NMOS transistors M42 to M45, and resistors R6 and R7.

The bias circuit shown in FIG. 9 is a cascode circuit. The current flowing through the transistors M41 and M43 is defined on a constant defined by a thermal voltage kT/q and a size ratio and a resistance of the resistor R7. The bias circuit shown in FIG. 9 is different from the bias circuit shown in FIG. 8 in a respect that the resistor R7 and the transistors M42 and M43 are provided so that the transistors M44 and M45 form a cascade circuit. In the case of using the cascode circuit as shown in FIG. 9, for example, it is possible to generate the bias voltage PB2 to be supplied to the constant voltage generator 31 shown in FIG. 7. As described above, the use of the cascode circuit as the bias circuit makes it possible to more improve dependency of the bias current on the supply voltage.

As set forth above, according to the present invention, the use of a one-stage differential circuit makes it possible to supply a supply voltage to the oscillating amplifier for exciting the resonator. This eliminates the necessity of a phase compensation capacitance for preventing the oscillation of the supply voltage from the crystal oscillation circuit. Further, the crystal oscillation circuit may be realized with a simple circuit arrangement and a small area and provides a capability of stably oscillating at low consumed current.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A crystal oscillation circuit that oscillates based on an oscillation frequency of a crystal oscillator, comprising:
   a resonator being connected with said crystal oscillator;
   an oscillating amplifier for exciting said resonator; and
   a constant voltage generator for supplying a constant supply voltage to said oscillating amplifier through a one-stage differential circuit.

2. The crystal oscillation circuit according to claim 1, wherein a positive supply voltage is supplied to a drain of a transistor that corresponds to a reverse phase input terminal of said differential circuit.

3. The crystal oscillation circuit according to claim 1, further comprising a bias circuit for supplying a bias voltage generated on a thermal voltage and a resistance to said differential circuit.

4. The crystal oscillation circuit according to claim 1, wherein said oscillating amplifier includes a transistor for cutting off current flown inside with a control signal.

5. A crystal oscillation circuit that oscillates on an oscillation frequency of a crystal oscillator, comprising:
   a resonator being connected with said crystal oscillator;
   an oscillating amplifier for exciting said resonator; and
   a constant voltage generator for supplying a constant supply voltage to said oscillating amplifier; and
   wherein:
   said constant voltage generator comprising:
      a bias circuit for generating a bias voltage based on a thermal voltage and a resistance; and
      a voltage generator for being inputted with said bias voltage and for generating said constant supply voltage based on said bias voltage.

6. The crystal oscillation circuit according to claim 5, wherein said voltage generator is composed of a constant current transistor being inputted with said bias voltage at a gate thereof and a capacitor being connected in series to said constant current transistor.

7. The crystal oscillation circuit according to claim 6, wherein said constant current transistor is a PMOS transistor.

* * * * *